(12) United States Patent
Tamaru

(10) Patent No.: US 6,952,140 B2
(45) Date of Patent: Oct. 4, 2005

(54) OCILLATOR AND ELECTRONIC DEVICE USING SAME

(75) Inventor: Ikuo Tamaru, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/334,945

(22) Filed: Jan. 2, 2003

(65) Prior Publication Data

US 2003/0128077 A1 Jul. 10, 2003

(30) Foreign Application Priority Data

Jan. 10, 2002 (JP) ........................................ 2002-003437

(51) Int. Cl.[7] ................................................ H03B 5/32
(52) U.S. Cl. .............. 331/158; 331/116 R; 331/116 FE
(58) Field of Search ............................. 331/158, 116 R, 331/116 FE, 117 FE, 117 R, 167

(56) References Cited

U.S. PATENT DOCUMENTS 4,001,724 A 1/1977 Keller
4,587,497 A * 5/1986 Keller et al. ............ 331/116 R
5,805,028 A 9/1998 Kato

FOREIGN PATENT DOCUMENTS

EP 0 613 252 A2 8/1994
EP 0 824 290 A1 2/1998

OTHER PUBLICATIONS

Rejection Decision, "Oscillator and Electronic Device Using the Same." Chinese Application No. 03101034.2, Jul. 8, 2005.

* cited by examiner

Primary Examiner—Arnold Kinkead
(74) Attorney, Agent, or Firm—Keating & Bennett LLP

(57) ABSTRACT

An oscillator includes an oscillating active element having a first main electrical-current path, a buffer-amplifying active element that is of the same type as the oscillating active element, the buffer-amplifying active element having a second main electrical-current path, and a load impedance for the buffer-amplifying active element. The first main electrical-current path, the second main electrical-current path, and the load impedance are connected in series between a power-supply terminal and ground in that order, and the node of the buffer-amplifying active element and the load impedance is a signal outputting point.

15 Claims, 12 Drawing Sheets

1

OCILLATOR AND ELECTRONIC DEVICE USING SAME

BACKGROUND OF THE INVENTION

1. Field of the Invention

The present invention relates to oscillators and electronic devices, and more particularly, to an oscillator that includes a crystal oscillator used for a PLL circuit in a portable telephone, and other suitable devices, and that provides a reference frequency and to an electronic device including the oscillator.

2. Description of the Related Art

FIG. 10 is a circuit diagram of a conventional oscillator. Referring to FIG. 10, an oscillator 1 includes a transistor Q1, which defines an active element for buffer amplification (hereinafter referred to as a "buffer-amplifying active element"), a transistor Q2, which defines an active element for oscillation (hereinafter referred to as an "oscillating active element"), a crystal oscillator X1, resistors R1 to R5, and capacitors C1 to C5.

In this conventional oscillator, a power-supply terminal +Vcc, to which a positive power-supply voltage is applied, is connected to ground via the capacitor C1 and is also connected to the collector of the transistor Q1 via the resistor R1, which defines a load impedance. The collector of the transistor Q1 is connected to an output terminal Po via the capacitor C2, and the emitter thereof is connected to the collector of the transistor Q2. The emitter of the transistor Q2 is connected to ground via the resistor R2. The power-supply terminal +Vcc is also connected to ground via a sequence of the resistors R3, R4, and R5. The node of the resistors R3 and R4 is connected to the base of the transistor Q1 and is also connected to ground via the capacitor C3. The node of the resistors R4 and R5 is connected to the base of the transistor Q2 and is also connected to ground via the crystal oscillator X1. Further, the capacitor C4 is connected between the base and the emitter of the transistor Q2, and the capacitor C5 is connected in parallel with the resistor R2.

In the oscillator 1 having the configuration described above, an oscillation circuit, which is defined by the transistor Q2 and the crystal oscillator X1 is a common-collector Colpitts circuit, but is a modified Colpitts circuit since the collector of the transistor Q2 is connected to the emitter of the transistor Q1 rather than being connected to ground.

In this modified Colpitts circuit, a capacitor that is provided in the loop between the base and emitter of a transistor in a typical Colpitts circuit is the capacitor C4. A portion corresponding to an inductor that is provided in the loop between the base and the collector is a series-connected portion including the crystal oscillator X1, the capacitor C3, which is connected to the crystal oscillator X1 via ground, and the base and emitter of the transistor Q1. A portion corresponding to a capacitor provided in the loop between the emitter and the collector is a series-connected portion including the capacitor C5, the capacitor C3, which is connected to the capacitor C5 via ground, and the base and emitter of the transistor Q1.

The transistor Q1 provides a common-base buffer-amplifying circuit, in which the base thereof is connected to ground via the capacitor C3 so as to ground the base at higher frequencies. The transistor Q1 receives, at the emitter thereof, an oscillation signal output from the collector of the transistor Q2 in the oscillation circuit, and amplifies the oscillation signal and outputs it from the collector of the transistor Q1 to the output terminal Po via the capacitor C2, which eliminates direct current. Thus, the node of the resistor R1 and the transistor Q1 defines a signal outputting point.

The main electrical current in the oscillator 1 flows through the resistor R1, a first path between the collector and the emitter of the transistor Q1, the first path being a main current path of the transistor Q1, a second path between the collector and the emitter of the transistor Q2, the second path being a main current path of the transistor Q2, and the resistor R2. In other words, the transistors Q1 and Q2 are connected in series on paths through which the main current flows between the power-supply terminal +Vcc and ground.

The resistors R3, R4, and R5 are bias resistors for introducing base current to the two transistors Q1 and Q2. In the oscillator 1, since the oscillation circuit is a modified Colpitts circuit, it is not necessary to provide a capacitor for coupling between the transistors Q1 and Q2.

FIG. 11 shows voltage waveforms in individual portions of the transistors Q1 and Q2 in the oscillator 1. Of the illustrated voltages, a voltage at the collector of the transistor Q1 is an output voltage and is thus output via the capacitor C2, which eliminates direct current. As shown in FIG. 11, the slope of the waveform of the collector voltage of the transistor Q1 is gentle in the rising portion and is steep in the falling portion.

The reason for this waveform will now be described. First, the oscillation circuit, which includes the transistor Q2, oscillates using an oscillator loop that includes the crystal oscillator X1. During oscillation, the waveform of the base voltage of the transistor Q2 is a substantially sinusoidal wave due to a filtering effect of the crystal oscillator X1.

When the transistor Q2 is in the OFF state, the capacitor C5 is not charged because no current is flowing through the resistor R2. In this case, an increased base voltage of the transistor Q2 causes an increase in a voltage across the emitter and the base to turn the transistor Q2 on, and current flows between the collector and the emitter and then flows through the resistor R2 to thereby cause the emitter voltage to increase. The current, however, is first utilized for charging the capacitor C5, and thus the emitter voltage does not increase immediately. During this period, since the base voltage has a tendency to increase, the rate of increase in voltage across the base and the emitter increases, such that the transistor Q2 is rapidly turned on and the collector voltage rapidly drops. This turns off the transistor Q1 rapidly, and thus, current flows rapidly between the collector and the emitter thereof. As a result, the collector voltage (output voltage) of the transistor Q1 decreases rapidly. Thus, the waveform of the collector voltage is steep.

When the charging of the capacitor C5 ends, the current flows through the resistor R2, such that the emitter voltage of the transistor Q2 increases according to the base voltage and then decreases after reaching a maximum.

When the voltage across the base and the emitter is reduced due to a decrease in the base voltage, the transistor Q2 has a tendency to turn off, however, since the emitter voltage is reduced concurrently, the voltage across the base and the emitter slowly decreases and the transistor Q2 is turned off slowly. During this period, since the current continues to flow between the collector and the emitter of the transistor Q2 while it is decreasing, the collector voltage of the transistor Q2 increases slowly. Thus, the transistor Q1 is also turned off slowly. As a result, the collector voltage (output voltage) of the transistor Q1 also increases slowly. Thus, the slope of the waveform of the collector voltage is gentle.

Subsequently, this operation returns to the first state and the above-described cycle is repeated.

In this manner, the oscillator 1 provides an output signal that has a waveform that is gentle in the rising portion and is steep in the falling portion.

Meanwhile, in a PLL circuit using such an oscillator 1 as a reference signal source, the frequency of an output oscillation signal is stabilized such that a signal output from the oscillator 1 is frequency-divided more than once, the phase thereof is compared with the phase of a signal output from a voltage controlled oscillator having a frequency that has equivalently been pre-divided to be substantially the same, and the result is fed back to the voltage controlled oscillator.

When the signal output from the oscillator 1 is frequency-divided, a logic element (digital element) is provided at a stage prior to a frequency divider, in order to pre-shape the waveform of a signal input to the frequency divider into a rectangular waveform. Examples of the logic element includes an inverter (which herein means an inverting circuit of a logic element) and a buffer (which herein means a non-inverting circuit of a logic element) having a predetermined threshold.

A signal resulting from the waveform shaping is a rectangular waveform having a high level when the signal output from the oscillator 1 is at a level higher than the threshold of the buffer, and also having a low level when the signal output from the oscillator 1 is at a level lower than the threshold level of the buffer. When an inverter is used to shape the waveform, the high and low levels are inverted. The frequency divider in the PLL circuit performs frequency division using the rising or falling portion of a digital signal resulting from the waveform shaping as a trigger.

Further, since the frequency divider is defined by a combination of logic elements including an RS flip flop, it is also possible to perform waveform shaping concurrently with the frequency division at a first stage in the frequency divider by inputting the signal output from the oscillator 1 directly to the frequency divider.

Meanwhile, the level of the signal output from the oscillator 1 varies depending upon, for example, a change in power-supply voltage and/or ambient temperature. Further, the output achieves a high or low level depending on the relationship between a signal input to a logic element and a threshold. Thus, when a signal output from the oscillator 1 changes, as shown in part (a) of FIG. 12, due to a variation in the level of the signal, the timings of the rising or falling of a signal output from the logic element deviates as shown in part (b) of FIG. 12. As shown in FIG. 12, the deviation in timings increases as the absolute value of the gradient of the waveform of the rising portion or the falling portion of an input signal decreases. As shown in FIG. 12, with the oscillator 1, a large variation is generated in the timing of the rising portion of an output from the logic element. Thus, when the level of an oscillation signal varies with time, a fluctuation is generated in the timing of rising of a signal output from the logic element. In this case, when the absolute value of the gradient of a waveform increases, such as the waveform of the falling portion of the oscillation signal, the fluctuation in the timing decreases.

When a signal having a large timing fluctuation in the rising portion is frequency-divided, dividing the frequency thereof using the large fluctuation side as a trigger results in a large fluctuation in the resulting signal at timings of both of the rising and falling portions. This means that a fluctuation in a signal that defines a reference for the PLL circuit is large. Consequently, jitter (in an oscillation signal output from the PLL circuit), which is a fluctuation in a signal output from the voltage controlled oscillator itself increases.

Accordingly, in order to reduce jitter in an oscillation signal output from the PLL circuit, a frequency divider must be triggered so as to correspond to a portion where the absolute value of the gradient of the waveform of a signal output from an oscillator is increased.

In a typical PLL circuit, however, a frequency divider is commonly triggered in the rising portion of an input signal. Thus, when an oscillator, such as an oscillator 1, is used as a reference signal source, jitter in an oscillation signal output from the PLL circuit still increases.

SUMMARY OF THE INVENTION

To overcome the above-described problem, preferred embodiments of the present invention provide an oscillator that greatly reduces jitter in an oscillation signal output from a PLL circuit, and also provide an electronic device including the oscillator.

According to a preferred embodiment of the present invention, an oscillator includes an oscillating active element having a first main electrical-current path, a buffer-amplifying active element that is similar to the oscillating active element, the buffer-amplifying active element having a second main electrical-current path, and a load impedance for the buffer-amplifying active element. The first main electrical-current path, the second main electrical-current path, and the load impedance are connected in series between a power-supply terminal and ground in that order, and a node of the buffer-amplifying active element and the load impedance is a signal outputting point.

The oscillator according to this preferred embodiment of the present invention provides a steep waveform in the rising portion of an output signal, which thereby greatly reduces jitter in an oscillation signal output from a PLL circuit using the oscillation circuit.

Preferably, the oscillator includes a piezoelectric oscillator, such as a crystal oscillator, as an inductance element for resonance which is connected to the oscillating active element.

According to another preferred embodiment of the invention, an electronic device is provided that includes the novel oscillator described above.

With this arrangement, the oscillator according to preferred embodiments of the present invention greatly reduces jitter in an oscillation signal output from a PLL circuit.

In addition, since the electronic device according to the present invention includes the oscillator of the present invention, the electronic device provides outstanding performance.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
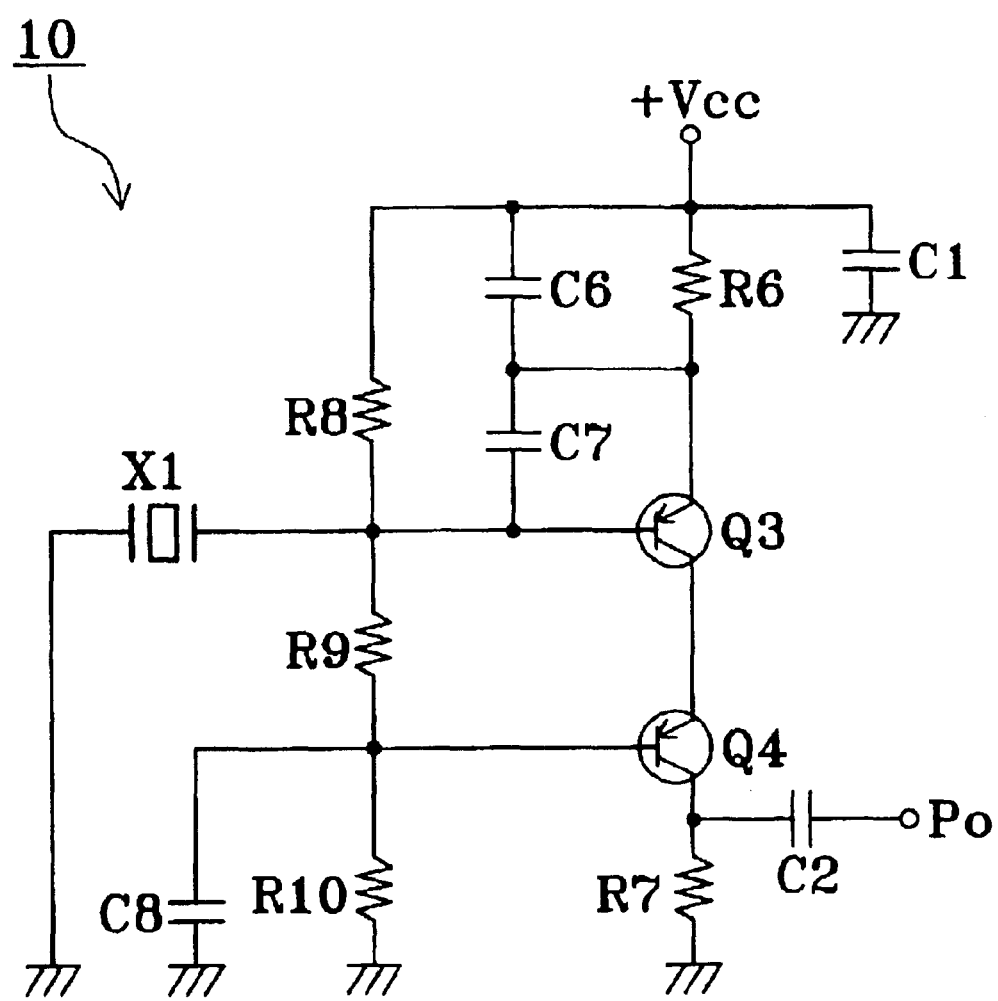
FIG. 1 is a circuit diagram showing an oscillator according one preferred embodiment of the present invention.
Figure 10:
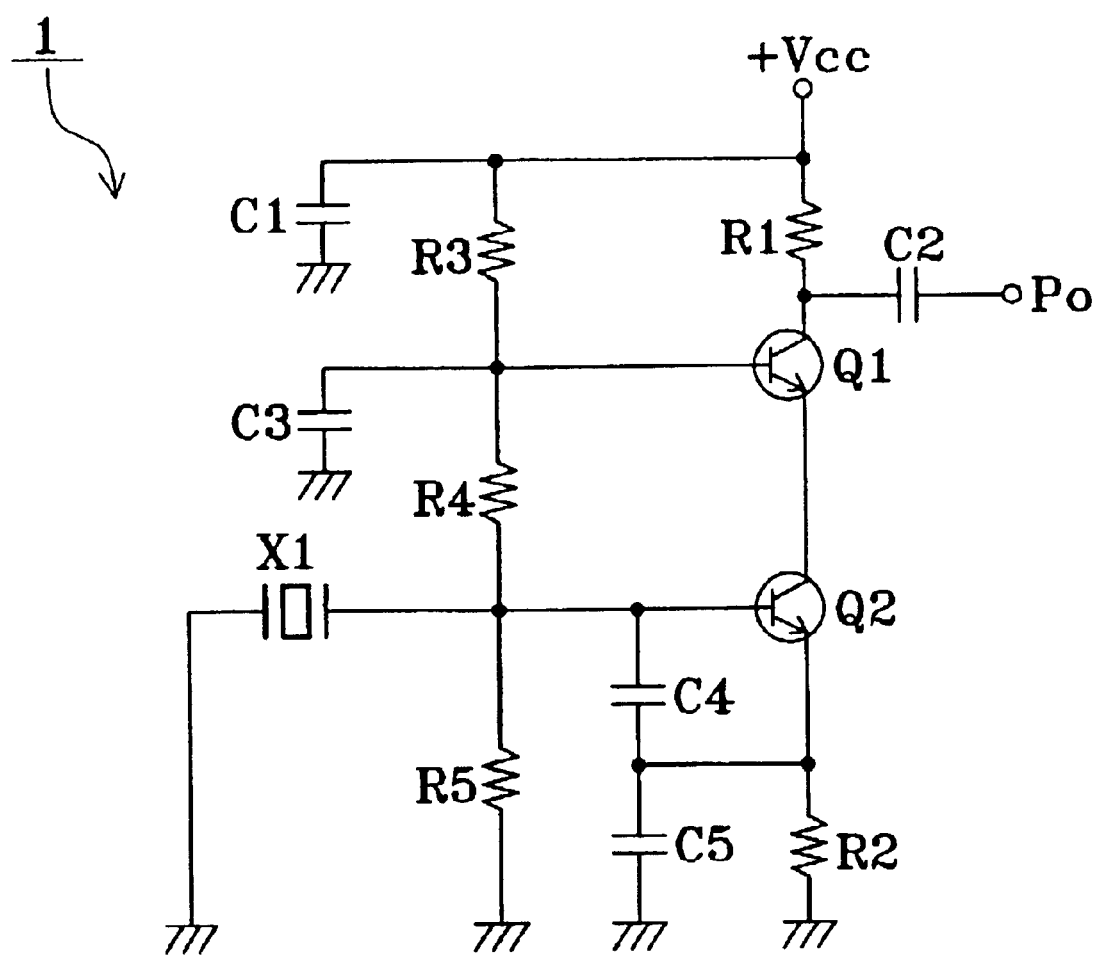
FIG. 10 is a circuit diagram showing an oscillator of the related art.
Figure 11:
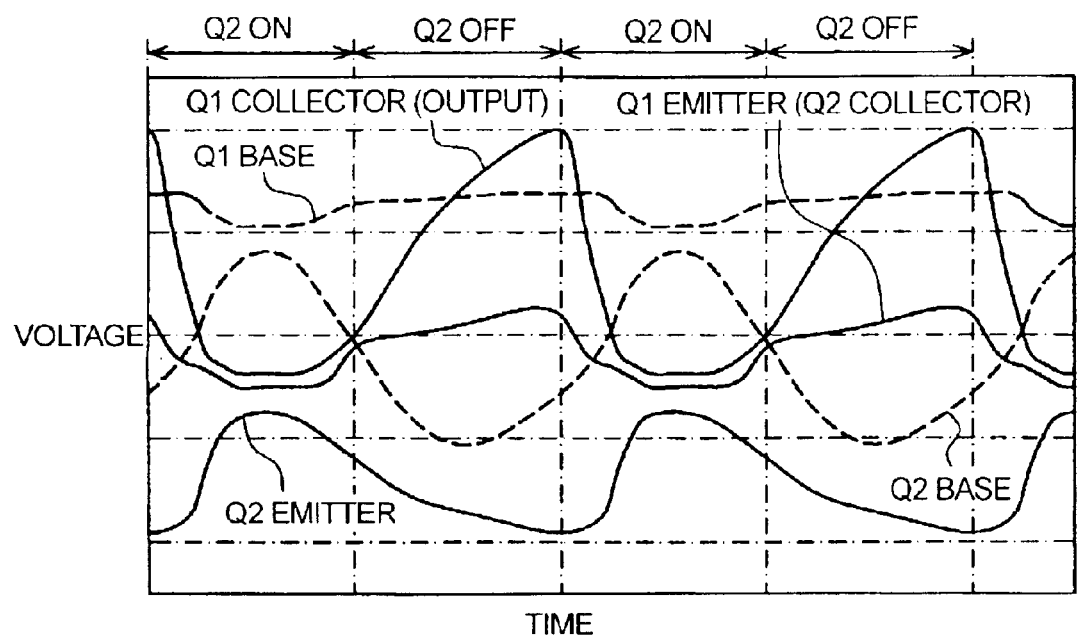
FIG. 11 is a waveform view showing voltage waveforms of individual portions in the oscillator shown in FIG. 10.
Figure 12:
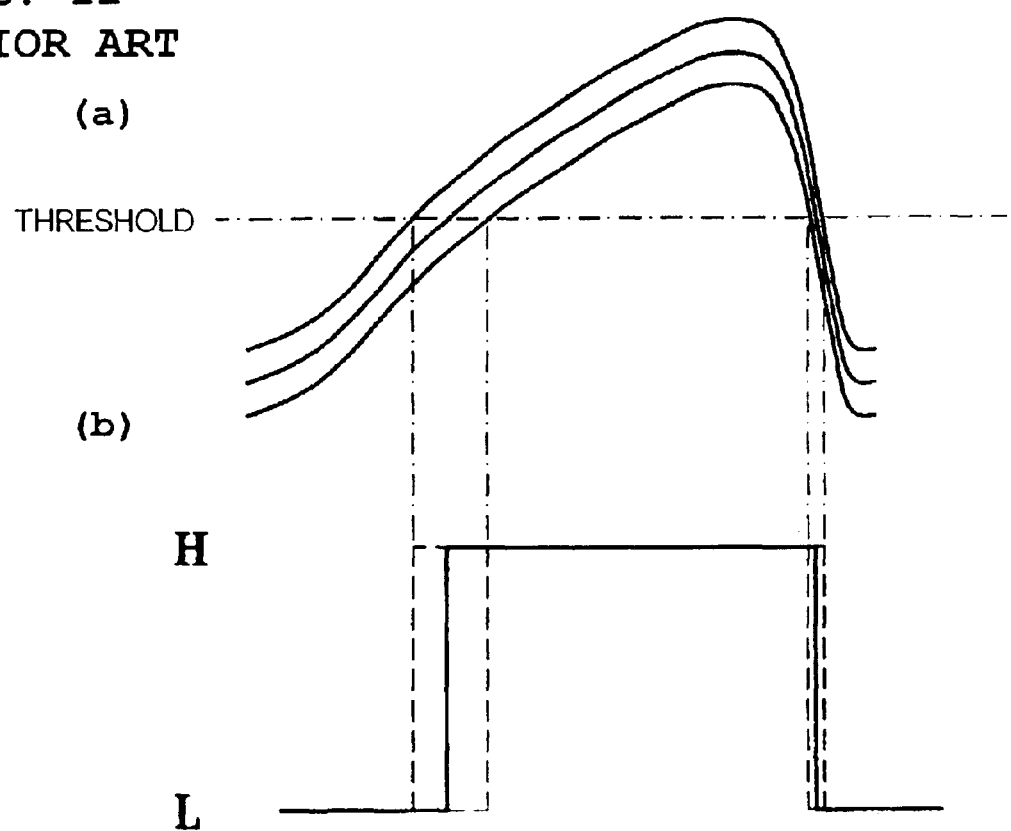
FIG. 12 is a waveform view showing the relationship between a variation in the level of a signal output from the oscillator shown in FIG. 10 and jitter in the signal.

FIG. 1 is a circuit diagram of an oscillator according to a preferred embodiment of the present invention. In FIG. 1, similar elements shown in FIG. 10 are denoted with the same reference symbols, and the descriptions thereof are omitted.

Referring to FIG. 1, an oscillator 10 according to a preferred embodiment includes a transistor Q3 which defines an oscillating active element, a transistor Q4 which defines a buffer-amplifying active element Q4, a crystal oscillator X1, resistors R6 to R10, and capacitors C1, C2, and C6 to C8. The transistors Q3 and Q4 are preferably three-terminal active elements of the same type, for example, PNP bipolar transistors.

In the present invention, active elements of the same type mean not only active elements that include the same structural elements, including a bipolar transistor and FET (field effect transistor), but also the same in carrier-type classification, such as a PNP- and NPN-type bipolar transistor or a P- or N-channel-type FET.

A power-supply terminal +Vcc, to which a positive power-supply voltage is applied, is connected to ground via the capacitor C1 and is also connected to the emitter of the transistor Q3 via the resistor R6. The collector of the transistor Q3 is connected to the emitter of the transistor Q4. The collector of the transistor Q4 is connected to ground via the resistor R7, which defines a load impedance. The node of the collector of the transistor Q4 and the resistor R7 is connected to an output terminal Po via the capacitor C2. The power-supply terminal +Vcc is also connected to ground via a sequence of the resistors R8, R9, and R10. The node of the resistors R8 and R9 is connected to ground via the base of the transistor Q3 and is also connected to the crystal oscillator X1. The node of the resistors R9 and R10 is connected to the base of the transistor Q4 and is also connected to ground via the capacitor C8. The capacitor C6 is connected in parallel with the resistor R6, and the capacitor C7 is connected between the base and the emitter of the transistor Q3.

In the oscillator 10, an oscillation circuit, which is defined by the transistor Q3, the crystal oscillator X1, and other elements, is preferably essentially a common-collector Colpitts circuit, but is a modified Colpitts circuit since the collector is connected to the emitter of the transistor Q4 rather than being connected to ground.

In this modified Colpitts circuit, capacitor C7 is included in the loop between the base and emitter of a transistor Q3 in a typical Colpitts circuit. An inductor in the loop between the base and the collector is a series-connected portion including the crystal oscillator X1, the capacitor C8, which is connected to the crystal oscillator X1 via ground, and the base and emitter of the transistor Q4. A portion corresponding to a capacitor in the loop between the emitter and collector is a series-connected portion including the capacitor C6, the capacitor C1, which is connected to the capacitor C6 via the power-supply terminal +Vcc, the capacitor C8, which is connected to the capacitor C1 via ground, and the base and emitter of the transistor Q4.

The transistor Q4 provides a common-base buffer-amplifying circuit, in which the base thereof is connected to ground via the capacitor C8 so as to ground the base at higher frequencies. The transistor Q4 receives, at the emitter thereof, an oscillation signal output from the collector of the transistor Q3 in the oscillation circuit, and amplifies the oscillation signal and outputs it from the collector of the transistor Q4 to the output terminal Po via the capacitor C2. Thus, the node of the transistor Q4 and the resistor R7 defines a signal outputting point.

A main electrical current in the oscillator 10 flows through the resistor R6, a first path between the emitter and the collector of the transistor Q3, the first path being a main current path of the transistor Q3, a second path between the emitter and the collector of the transistor Q4, the second path being a main current path of the transistor Q4, and the resistor R7. In other words, the transistors Q3 and Q4 and the resistor R7 are connected in series on paths through which the main current flows between the power-supply terminal +Vcc and ground.

The resistors R8, R9, and R10 are bias resistors for introducing base current to the two transistors Q3 and Q4. In the oscillator 10, since the oscillation circuit is preferably a modified Colpitts circuit, it is not necessary to provide a capacitor for coupling between the transistors Q3 and Q4.

Figure 2:
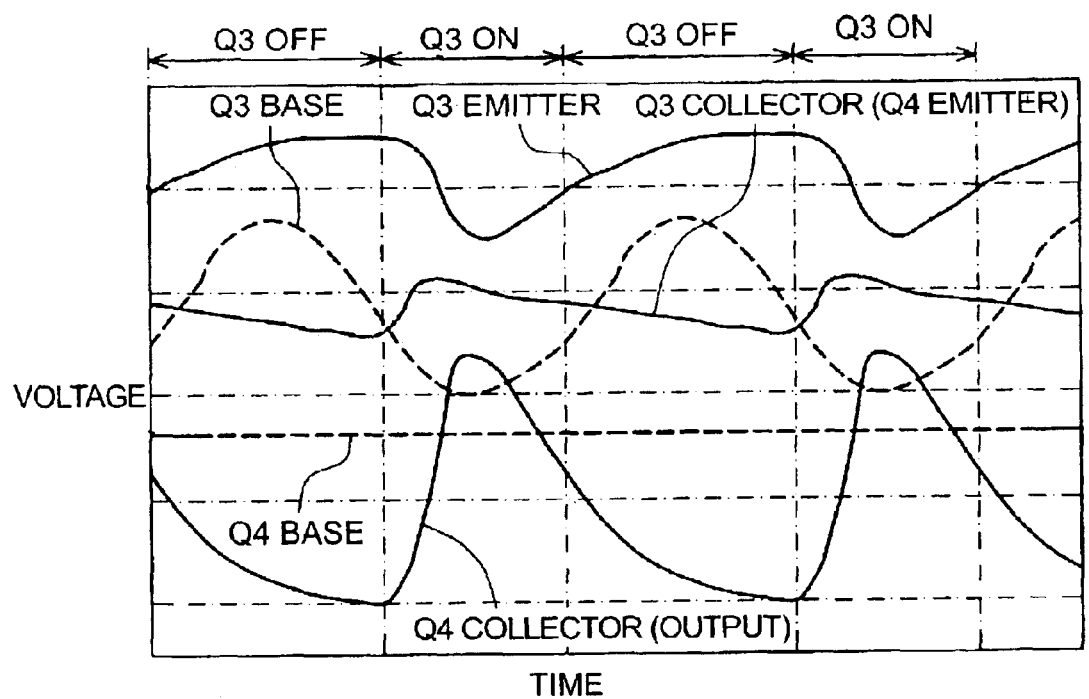
FIG. 2 is a waveform view showing voltage waveforms of individual portions in the oscillator shown in FIG. 1.

FIG. 2 shows voltage waveforms in individual portions of the transistors Q3 and Q4 in the oscillator 10. Of the illustrated voltages, the collector voltage of the transistor Q4 is an output voltage, and thus, is output via the capacitor C2, which eliminates direct current. As shown in FIG. 2, the waveform of the collector voltage of the transistor Q4 is steep in the rising portion and becomes gentle in the falling portion. This is opposite to the characteristic of the collector voltage of the transistor Q1 in the oscillator 1 of the related art.

The reason for this will now be described. First, the oscillation circuit, which includes the transistor Q3, performs oscillation using an oscillator loop that includes the crystal oscillator X1. During oscillation, the waveform of the base voltage of the transistor Q3 is a substantially sinusoidal wave due to a filtering effect of the crystal oscillator X1.

When the transistor Q3 is in the OFF state, the capacitor C6 is not charged since no current is flowing through the resistor R6. At this point, when the base voltage of the transistor Q3 decreases to increase a voltage across the emitter and the base and to thereby turn on the transistor Q3, the current flowing between the emitter and the collector causes the collector voltage to increase. In this case, the current flowing between the emitter and the collector increases rapidly since it flows through the capacitor C6 before flowing through the resistor R6. Thus, the rate of increase in the collector voltage is high. This turns on the transistor Q4 rapidly, and causes current to rapidly flow between the emitter and the collector of the transistor Q4. As a result, the collector voltage (output voltage) of the transistor Q4 also increases rapidly. Thus, the waveform of the collector voltage is steep.

When charging of the capacitor C6 due to the current flowing through the capacitor C6 ends and the current begins to flow through the resistor R6, the emitter voltage of the transistor Q3 decreases according to the base voltage and then increase after reaching a minimum value.

When the voltage across the emitter and the base is reduced due to an increase in the base voltage, the transistor Q3 tends to be turned off, however, since the emitter voltage increases concurrently, the voltage across the emitter and the base decreases slowly. Thus, the transistor Q3 is not turned off quickly, but rather is turned off slowly. During this period, since the current continues to flow between the emitter and the collector of the transistor Q3 while it is decreasing, the collector voltage of the transistor Q3 decreases slowly. Thus, the transistor Q4 is also turned off slowly. As a result, the collector voltage (output voltage) of the transistor Q4 also decreases slowly. Thus, the waveform of the collector voltage becomes gentle.

Subsequently, this operation returns to the first state and the above-described cycle is repeated.

Consequently, the oscillator 10 provides an output signal having a waveform that is steep in the rising portion and is gentle in the falling portion. Thus, even when the frequency of a signal is divided in a PLL circuit using the rising portion of the signal as a trigger, jitter in the divided signal does not increase, which consequently eliminates a problem of increased jitter in an oscillation signal output from the PLL circuit. This advantage is particularly significant in an oscillator that includes a crystal oscillator and that is used as a reference signal source.

Figure 3:
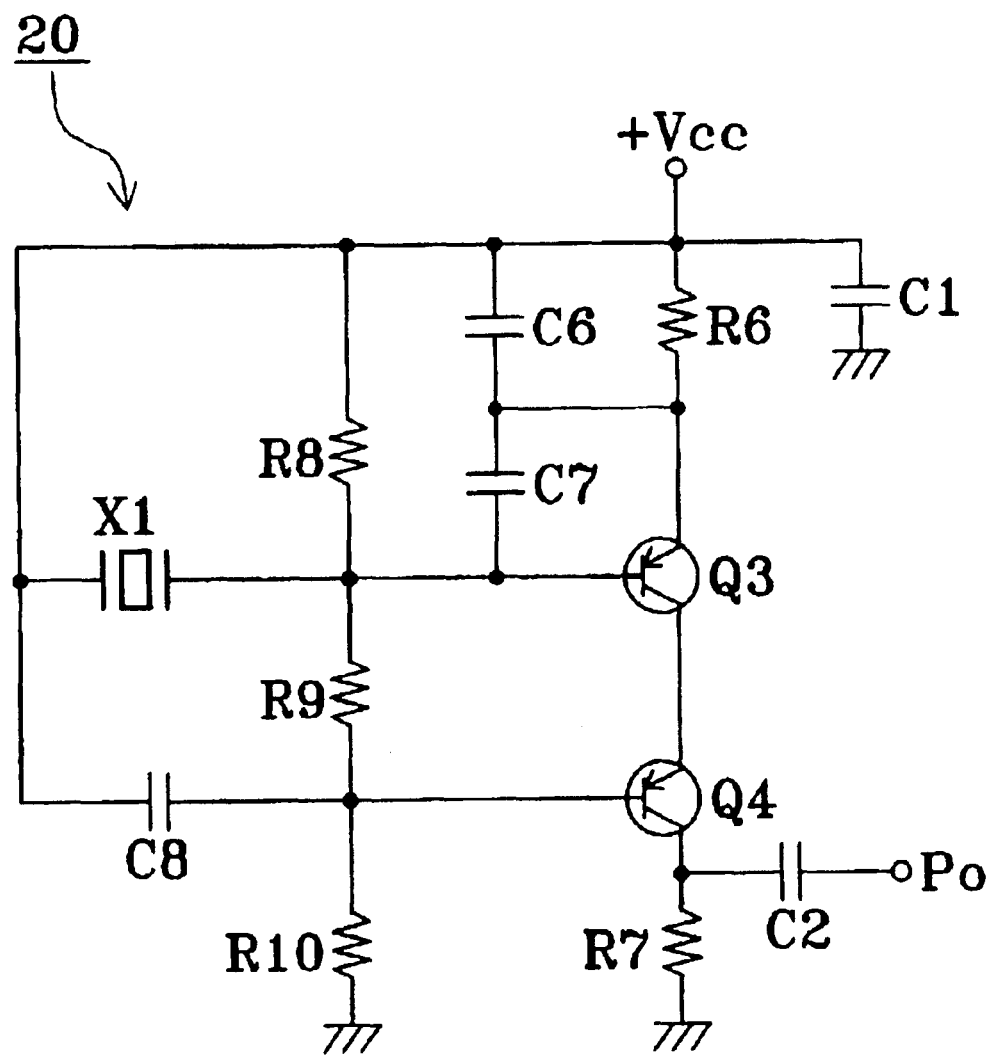
FIG. 3 is a circuit diagram showing an oscillator according another preferred embodiment of the present invention.

FIG. 3 is a circuit diagram of an oscillator according to another preferred embodiment of the present invention. In FIG. 3, similar elements shown in FIG. 1 are denoted with the same reference symbols, and the descriptions thereof are omitted.

An oscillator 20 shown in FIG. 3 includes a modified Colpitts circuit as in the oscillator 10, but is different therefrom in that the crystal oscillator X1 is connected between the base of the transistor Q3 and the power-supply terminal +Vcc, and the capacitor C8 is connected between the base of the transistor Q4 and the power-supply terminal +Vcc.

In this modified Colpitts circuit, a capacitor that is included in the loop between the base and emitter of a transistor Q3 in a typical Colpitts circuit is the capacitor C7. A portion defining an inductor in the loop between the base and the collector is a series-connected portion including the crystal oscillator X1, the capacitor C8, which is connected to the crystal oscillator X1 via the power-supply terminal +Vcc, and the base and emitter of the transistor Q4. A portion defining a capacitor in the loop between the emitter and the collector is a series-connected portion including the capacitor C6, the capacitor C8, which is connected to the capacitor C6 via the power-supply terminal +Vcc, and the base and emitter of the transistor Q4.

The oscillator 20 configured in the above manner operates in a similar manner to the oscillator 10 and has the same advantages.

In practice, an oscillator is fabricated such that transistors and a crystal oscillator which are defined by chips, resistors, and capacitors are mounted on electrodes that are provided on a printed circuit board, however, it is often difficult to arrange the components due to miniaturization of the printed circuit board and a designed shape thereof. Either one of the oscillators 10 and 20 provides the same performance, thus, providing greater flexibility in component layout.

Figure 4:
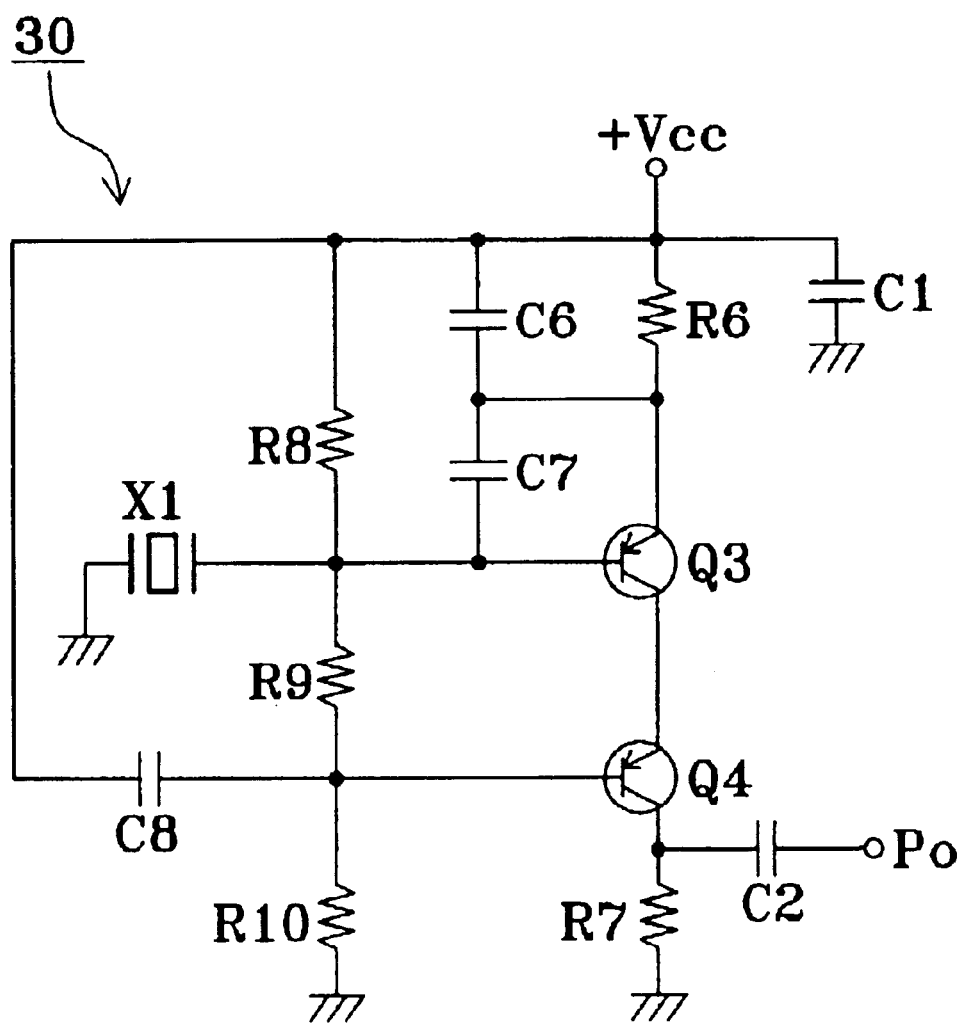
FIG. 4 is a circuit diagram showing an oscillator according to yet another preferred embodiment of the present invention.

FIG. 4 is a circuit diagram of an oscillator according to yet another preferred embodiment of the present invention. In FIG. 4, similar elements shown in FIG. 1 are denoted with the same reference symbols, and the descriptions thereof are omitted.

An oscillator 30 shown in FIG. 4 includes a modified Colpitts circuit as in the oscillator 10, but is different therefrom in that the capacitor C8 is connected between the base of the transistor Q4 and the power-supply terminal +Vcc.

In this modified Colpitts circuit, an element defining a capacitor that is included in the loop between the base and emitter of a transistor Q3 in a typical Colpitts circuit is the capacitor C7. A portion defining an inductor in the loop between the base and the collector is a series-connected portion including the crystal oscillator X1, the capacitor C1, which is connected to the crystal oscillator X1 via ground, the capacitor C8, which is connected to the capacitor C1 via the power-supply terminal +Vcc, and the base and emitter of the transistor Q4. An element defining a capacitor in the loop between the emitter and the collector is a series-connected portion including the capacitor C6, the capacitor C8, which is connected to the capacitor C6 via the power-supply terminal +Vcc, and the base and emitter of the transistor Q4.

The oscillator 30 operates in a similar manner to the oscillators 10 and 20 and achieves the same advantages. Further, the oscillator 30 has greater flexibility in component layout.

Figure 5:
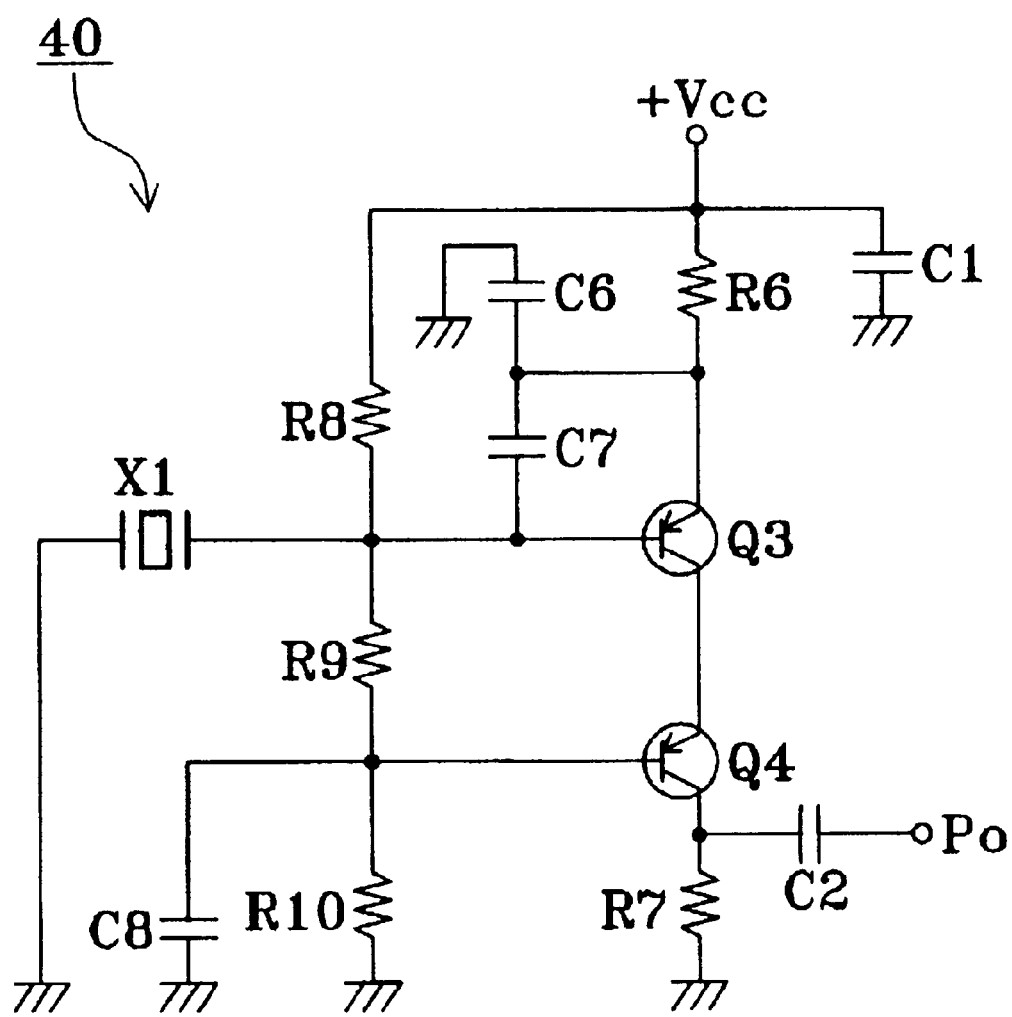
FIG. 5 is a circuit diagram showing an oscillator according to yet another preferred embodiment of the present invention.

FIG. 5 is a circuit diagram of an oscillator according to still another preferred embodiment of the present invention. In FIG. 5, similar elements or portions shown in FIG. 1 are denoted with the same reference symbols, and the descriptions thereof are omitted.

An oscillator 40 shown in FIG. 5 includes a modified Colpitts circuit as in the oscillator 10, but is different therefrom in that the capacitor C6 is connected between the emitter of the transistor Q3 and ground.

In this modified Colpitts circuit, an element defining a capacitor that is included in the loop between the base and emitter of a transistor Q3 in a typical Colpitts circuit is the capacitor C7. A portion defining an inductor in the loop between the base and the collector is a series-connected portion including the crystal oscillator X1, the capacitor C8, which is connected to the crystal oscillator X1 via ground, and the base and emitter of the transistor Q4. A portion defining to a capacitor in the loop between the emitter and the collector is a series-connected portion including the capacitor C6, the capacitor C8, which is connected to the capacitor C6 via ground, and the base and emitter of the transistor Q4.

The oscillator 40 operates in a similar manner to the oscillators 10, 20 and 30 and achieves the same advantages. Further, the oscillator 40 has greater flexibility in component layout.

Additionally, in the case of the oscillator 40, none of the three loops for the Colpitts circuit goes through the power-supply terminal +Vcc. Thus, unlike the oscillators 10, 20, and 30, the capacitance of the capacitor C1, which is a bypass capacitor for the power-supply terminal +Vcc, has less effect on the oscillation, thus allowing the capacitor C1 to be omitted.

Figure 6:
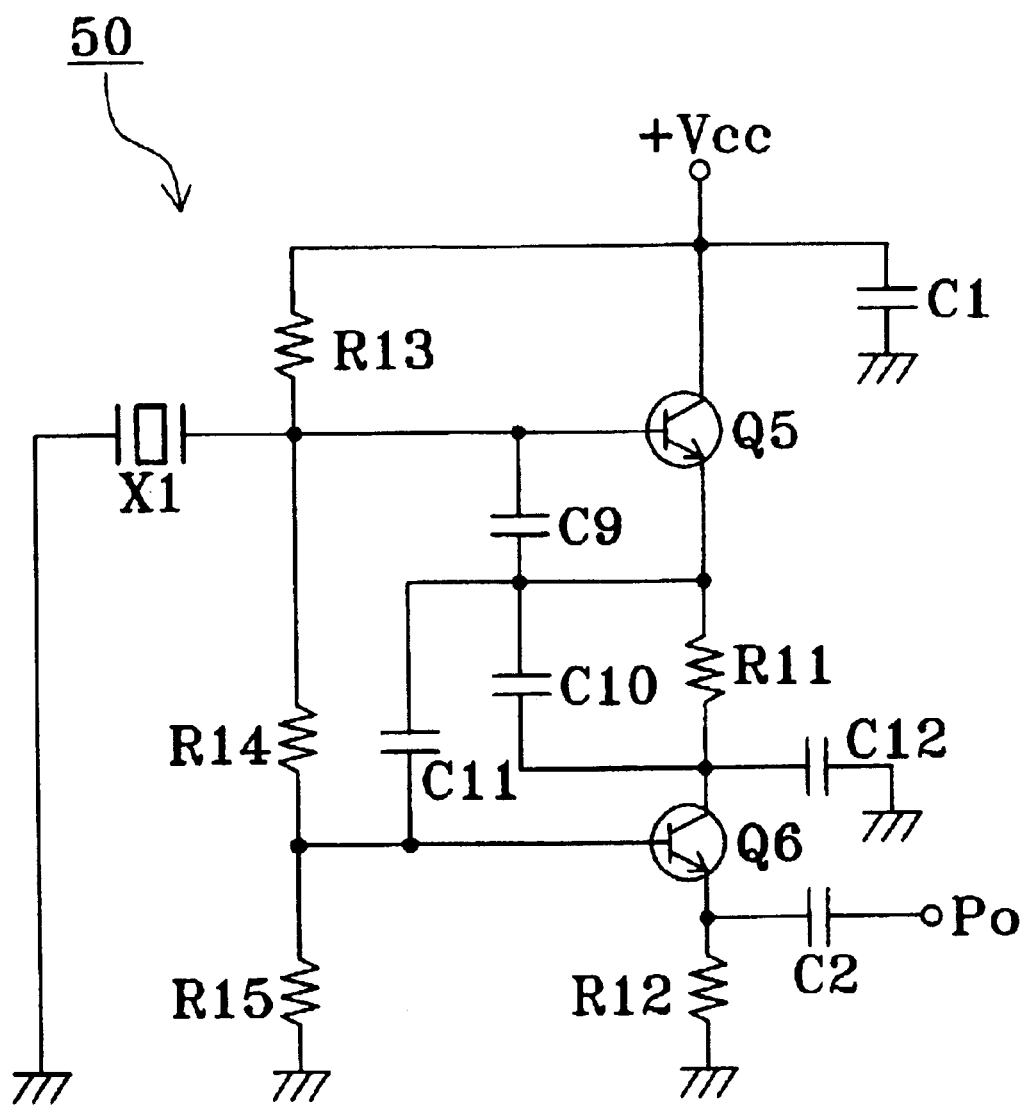
FIG. 6 is a circuit diagram showing an oscillator according to yet another preferred embodiment of the present invention.

FIG. 6 is a circuit diagram of an oscillator according to yet another preferred embodiment of the present invention. In FIG. 6, similar elements or portions shown in FIG. 10 are denoted with the same reference symbols, and the descriptions thereof are omitted.

Referring to FIG. 6, an oscillator 50 includes a transistor Q5 which defines an oscillating active element, a transistor Q6 which defines a buffer-amplifying active element, a crystal oscillator X1, resistors R11 to R15, and capacitors C1, C2, and C9 to C12. The transistors Q5 and Q6 are the same type of three-terminal active elements, that is, NPN bipolar transistors.

In this case, a power-supply terminal +Vcc, to which a positive power-supply voltage is applied, is connected to ground via the capacitor C1 and is also connected to the collector of the transistor Q5. The emitter of the transistor Q5 is connected to the collector of the transistor Q6 via the resistor R11. The collector of the transistor Q6 is connected to ground via the capacitor C12 and the emitter of the transistor Q6 is connected to ground via the resistor R12, which defines a load impedance. The node of the emitter of the transistor Q6 and the resistor R12 is connected to an output terminal Po via the capacitor C2. The power-supply terminal +Vcc is also connected to ground via a sequence of the resistors R13, R14, and R15. The node of the resistors R13 and R14 is connected to the base of the transistor Q5 and is also connected to ground via the crystal oscillator X1. The node of the resistors R14 and R15 is connected to the base of the transistor Q6. The capacitor C9 is connected between the base and the emitter of the transistor Q5, and the capacitor C10 is connected in parallel with the resistor R11. The base of the transistor Q6 is connected to the emitter of the transistor Q5 via the capacitor C11.

In the oscillator 50, an oscillation circuit, which is defined by the transistor Q5, the crystal oscillator X1, and the like, is a common-collector Colpitts circuit, in which the collector of the transistor Q5 is connected to ground via the capacitor C1 in order to ground the collector at higher frequencies.

In this Colpitts circuit, an element defining a capacitor in the loop between the base and the emitter of a transistor Q5 in a typical Colpitts circuit is the capacitor C9. Further, a portion defining an inductor included in the loop between the base and the collector is a portion including the crystal oscillator X1 and the capacitor C1, which is connected to the crystal oscillator X1 via ground. A portion defining a capacitor included in the loop between the emitter and the collector is a series-connected portion including the capacitor C10, the capacitor C12, and the capacitor C1, which is connected to the capacitor C12 via ground.

The transistor Q6 provides a common-collector buffer-amplifying circuit, in which the collector thereof is connected to ground via the capacitor C12 in order to ground the collector at the higher frequencies. The transistor Q6 receives, at the base thereof, an oscillation signal output from the emitter of the transistor Q5 of the oscillation circuit via the capacitor C11, and amplifies the oscillation signal and outputs it from the emitter of the transistor Q6 to the output terminal Po via the capacitor C2. Thus, the node of the transistor Q6 and the resistor R12 defines as a signal outputting point.

A main electrical current in the oscillator 50 flows through a first path between the collector and the emitter of the transistor Q5, the first path being a main current path thereof; the resistor R11, a second path between the collector and the emitter of the transistor Q6, the second path being a main current path thereof, and the resistor R12. In other words, the transistors Q5 and Q6 and the resistor R12 are connected in series on paths through which the main current flows between the power-supply terminal +Vcc and ground.

The resistors R13, R14, and R15 are bias resistors for providing base current to the two transistors Q5 and Q6.

The oscillator 50 also provides an output signal having a waveform that is steep in the rising portion and is gentle in the falling portion. Thus, the oscillator 50 achieves the same advantages as the oscillator 10.

In addition, the oscillator 50 includes NPN transistors, which have more types than PNP transistors, as the oscillating active element and the buffer-amplifying active element, such that more selections are available, thus reducing the cost of the oscillator.

Figure 7:
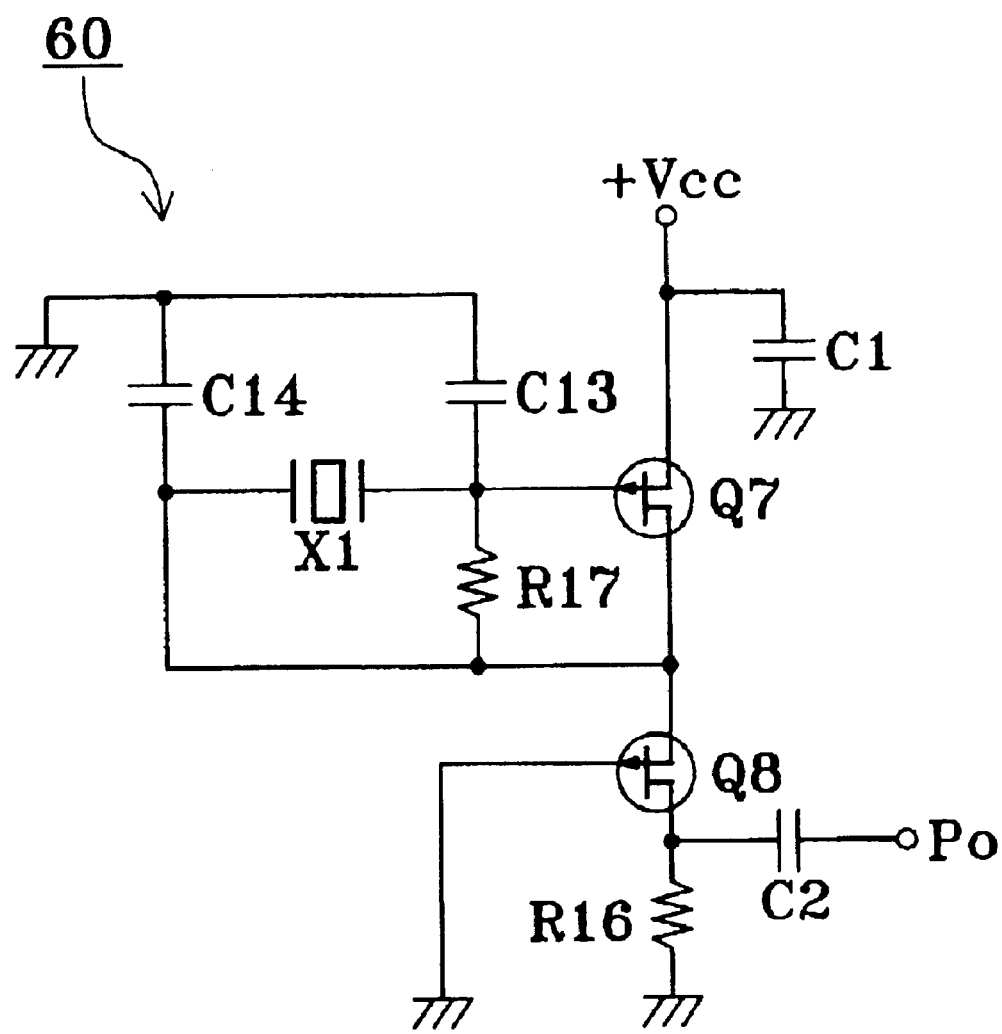
FIG. 7 is a circuit diagram showing an oscillator according to yet another preferred embodiment of the present invention.

FIG. 7 is a circuit diagram of an oscillator according to yet another preferred embodiment of the present invention. In FIG. 7, similar elements or portions shown in FIG. 10 are denoted with the same reference symbols, and the descriptions thereof are omitted.

Referring to FIG. 7, an oscillator 60 includes a FET (field effect transistor) Q7 which defines an oscillating active element, a FET Q8 which defines a buffer-amplifying active element, a crystal oscillator X1, resistors R16 and R17, and capacitors C1, C2, C13, and C14. The FETs Q7 and Q8 are the same type of three-terminal active elements, that is, P-channel FETs.

In this case, a power-supply terminal +Vcc, to which a positive power-supply voltage is applied, is connected to ground via the capacitor C1 and is also connected to the source of the FET Q7. The drain of the FET Q7 is connected to the source of the FET Q8. The gate of the FET Q8 is connected to ground and the drain thereof is connected to ground via the resistor R16, which is a load impedance. The node of the drain of the FET Q8 and the resistor R16 is connected to an output terminal Po via the capacitor C2. The gate of the FET Q7 is connected to ground via the capacitor C13 and is also connected to ground via a series circuit of the crystal oscillator X1 and the capacitor C14. The resistor R17 is connected between the gate and the drain of the FET Q7, and the node of the crystal oscillator X1 and the capacitor C14 is connected to the drain of the FET Q7.

In the oscillator 60, an oscillation circuit is a common-source Colpitts circuit, in which the source of the FET Q7 is connected to ground via the capacitor C1 in order to ground the source at higher frequencies.

In this Colpitts circuit, elements defining a capacitor included in the loop between the gate and the source of an FET Q7 in a typical Colpitts circuit are the capacitor C13 and the capacitor C1, which is connected to the capacitor C13 via ground. An element defining an inductor included in the loop between the gate and the drain is only the crystal oscillator X1. A portion defining a capacitor included in the loop between the drain and the source is a series-connected portion including the capacitor C14 and the capacitor C1, which is connected to the capacitor C14 via ground.

Meanwhile, the FET Q8 provides a common-gate buffer-amplifying circuit, in which the gate thereof is connected to ground. The FET Q8 receives, at the source thereof, an oscillation signal output from the drain of the FET Q7 in the oscillation circuit, and amplifies and outputs the oscillation signal from the drain of the FET Q8 to the output terminal Po via the capacitor C2. Thus, the node of the FET Q8 and the resistor R16 defines a signal outputting point.

A main electrical current in the oscillator 60 flows through a first path between the source and the drain of the FET Q7, the first path being a main current path thereof, a second path between the source and the drain of the FET Q8, the second path being a main current path thereof, and the resistor R16. In other words, the FETs Q7 and Q8 and the resistor R16 are connected in series on paths through which the main current flows between the power-supply terminal +Vcc and ground.

The oscillator 60 also provides an output signal having a waveform that is steep in the rising portion and is gentle in the falling portion. Thus, the oscillator 60 achieves the same advantages as the oscillator 10.

In addition, in the oscillator 60, the use of FETs for the amplifying active element and the buffer-amplifying active element eliminates the need for a bias resistor, and thus, reduces the number of components.

Figure 8:
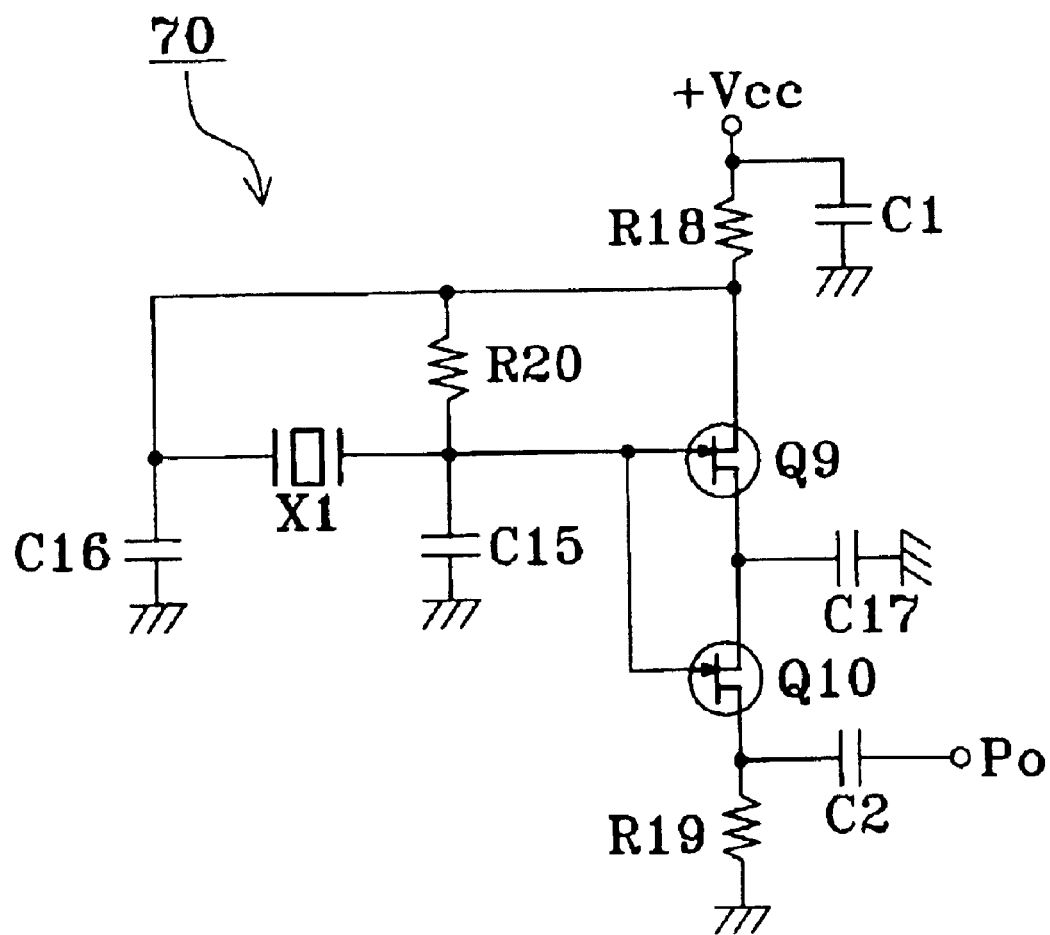
FIG. 8 is a circuit diagram showing an oscillator according to yet another preferred embodiment of the present invention.

FIG. 8 is a circuit diagram of an oscillator according to still another preferred embodiment of the present invention. In FIG. 8, similar elements or portions shown in FIG. 10 are denoted with the same reference symbols, and the descriptions thereof are omitted.

Referring to FIG. 8, an oscillator 70 includes an FET Q9 which defines an oscillating active element, an FET Q10 which defines a buffer-amplifying active element, a crystal oscillator X1, resistors R18 to R20, and capacitors C1, C2, and C15 to C17. The FETs Q9 and Q10 are the same type of three-terminal active elements, that is, N-channel FETs.

In this case, a power-supply terminal +Vcc, to which a positive power-supply voltage is applied, is connected to ground via the capacitor C1 and is also connected to the drain of the FET Q9 via the resistor R18. The source of the FET Q9 is connected to ground via the capacitor C17 and is connected to the drain of the FET Q10. The source of the FET Q10 is connected to ground via the resistor R19, which is a load impedance. The node of the drain of the FET Q10 and the resistor R19 is connected to an output terminal Po via the capacitor C2. The gate of the FET Q9 is connected to ground via the capacitor C15 and is also connected to ground via a series-connected circuit of the crystal oscillator X1 and the capacitor C16. The resistor R20 is connected between the gate and the drain of the FET Q9, and the node of the crystal oscillator X1 and the capacitor C16 is connected to the drain of the FET Q9. Further, the gate of the FET Q9 is connected to the gate of the FET Q10.

In the oscillator 70, an oscillation circuit is a common-source Colpitts circuit, in which the source of the FET Q9 is connected to ground via the capacitor C17 in order to ground the source at higher frequencies.

In this Colpitts circuit, elements defining a capacitor included in the loop between the gate and the source of a FET Q9 in a typical Colpitts circuit are the capacitor C15 and the capacitor C17 which is connected to the capacitor C15 via ground. An element defining an inductor included in the loop between the gate and the drain is the crystal oscillator X1. A portion defining a capacitor included in the loop between the drain and the source is a series-connected portion including the capacitor C16 and the capacitor C17, which is connected to the capacitor C16 via ground.

Meanwhile, the FET Q10 provides a common-drain buffer-amplifying circuit, in which the drain thereof is connected to ground via the capacitor C17 in order to ground the drain at higher frequencies. The FET Q10 receives, at the gate thereof, an oscillation signal output from the gate of the FET Q9 in the oscillation circuit, and amplifies the oscillation signal and outputs it from the source of the FET Q10 to the output terminal Po via the capacitor C2. Thus, the node of the FET Q10 and the resistor R19 defines a signal outputting point.

A main electrical current in the oscillator 70 flows through a first path between the drain and the source of the FET Q9, the first path being a main current path thereof, a second path between the drain and the source of the FET Q10, the second path being a main current path thereof, and the resistor R19. In other words, the FETs Q9 and Q10 and the resistor R19 are connected in series on paths through which the main current flows between the power-supply terminal +Vcc and ground.

The oscillator 70 also provides an output signal having a waveform that is steep in the rising portion and is gentle in the falling portion. Thus, the oscillator 70 achieves the same advantages as the oscillator 10.

In addition, in the oscillator 70, the use of FETs for the amplifying active element and the buffer-amplifying active element eliminates the need for a bias resistor, and also reduces the number of components in the same manner as the oscillator 60.

Figure 9:
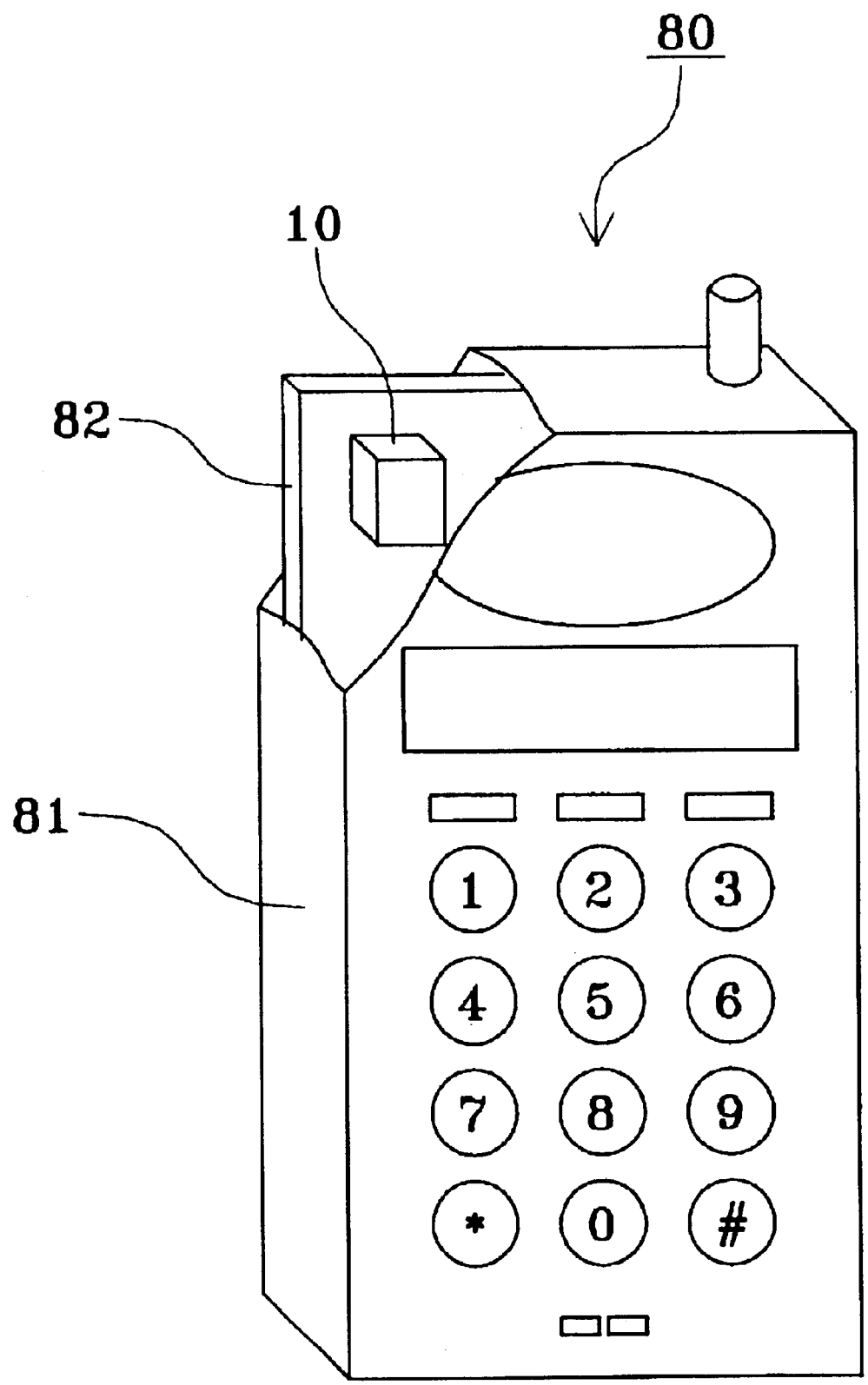
FIG. 9 is a circuit diagram showing an example of an electronic device according to another preferred embodiment of the present invention.

FIG. 9 is a perspective view showing one example of an electronic device according to another preferred embodiment of the present invention. Referring to FIG. 9, a portable telephone 80 includes a housing 81, a printed circuit board 82 arranged therein, and the oscillator according to preferred embodiments of the present invention, such as the oscillator 10, mounted on the printed circuit board 82.

The portable telephone 80 achieves high performance in terms of, for example, stability at the level of a small bit-error rate.

While the electronic device is illustrated in the form of a portable telephone in FIG. 9, the electronic devices of the present invention are not limited thereto, and may be any electronic device that uses the oscillator of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An oscillator comprising:
   an oscillating active element having a first main electrical-current path, the oscillating active element is a PNP bipolar transistor;
   a buffer-amplifying active element having a second main electrical-current path, the buffer-amplifying active element is a PNP bipolar translator; and
   a load impedance for the buffer-amplifying active element; wherein
   the first main electrical-current path, the second main electrical-current path, and the load impedance are connected in series between a power-supply terminal and ground in that order;
   a node of the buffer-amplifying active element and the load impedance is a signal outputting point; and
   the oscillating active element and the buffer-amplifying active element are directly connected to each other.

2. The oscillator according to claim 1, further comprising a piezoelectric oscillator defining an inductance element for resonance which is connected to the oscillating active element.

3. The oscillator according to claim 2, wherein the piezoelectric oscillator is a crystal oscillator.

4. The oscillator according to claim 1, wherein the load impedance is defined by a resistor.

5. The oscillator according to claim 2, wherein the piezo-electric oscillator is connected between a base of the oscillating active element and the power-supply terminal.

6. The oscillator according to claim 1, wherein a capacitor is connected between the base of the buffer-amplifying active element and the power-supply terminal.

7. The oscillator according to claim 1, wherein a capacitor is connected between an emitter of the oscillating active element and ground.

8. The oscillator according to claim 1, wherein the power-supply terminal is connected to ground via a capacitor and to a collector of the oscillating active element.

9. An oscillator comprising:

an oscillating active element having a first main electrical-current path, the oscillating active element is a NPN bipolar transistor;

a buffer-amplifying active element having a second main electrical-current path, the buffer-amplifying active element is a NPN bipolar transistor;

a load impedance for the buffer-amplifying active element; wherein the first main electrical-current path, the second main electrical-current path, and the load impedance are connected in series between a power-supply terminal and ground in that order;

a node of the buffer-amplifying active element and the load impedance is a signal outputting point;

the oscillating active element and the buffer-amplifying active element are directly connected to each other; and a collector of the buffer-amplifying active element is connected to ground via a capacitor and an emitter of the buffer-amplifying active element is connected to ground via the load impedance.

10. The oscillator according to claim 9, wherein an emitter of the oscillating active element is connected to a collector of the buffer-amplifying active element.

11. The oscillator according to claim 9, wherein the load impedance is defined by a resistor.

12. The oscillator according to claim 1, wherein the power-supply terminal is connected to ground via a capacitor and to a base of the oscillating active element.

13. The oscillator according to claim 1, wherein a base of the buffer-amplifying active element is connected to ground via the load impedance element.

14. The oscillator according to claim 1, wherein the oscillator is defined by a common-base Colpitts circuit.

15. An electronic device comprising the oscillator of claim 1.

* * * * *